United States Patent
Yeatman et al.

(10) Patent No.: US 9,893,653 B2
(45) Date of Patent: Feb. 13, 2018

(54) POWER GENERATION DEVICE

(71) Applicant: IMPERIAL INNOVATIONS LIMITED, London (GB)

(72) Inventors: Eric Morgan Yeatman, London (GB); Andrew Sean Holmes, Reading (GB); Pit Pillatsch, London (GB)

(73) Assignee: Imperial Innovations Limited, London (GB)

( * ) Notice: Subject to any disclaimer, the term of this patent is extended or adjusted under 35 U.S.C. 154(b) by 521 days.

(21) Appl. No.: 14/398,956

(22) PCT Filed: May 3, 2013

(86) PCT No.: PCT/GB2013/051172
§ 371 (c)(1),
(2) Date: Nov. 4, 2014

(87) PCT Pub. No.: WO2013/164648
PCT Pub. Date: Nov. 7, 2013

(65) Prior Publication Data
US 2015/0084482 A1   Mar. 26, 2015

(30) Foreign Application Priority Data
May 4, 2012   (GB) .................................. 1207987.7

(51) Int. Cl.
*H01L 41/113* (2006.01)
*H02N 2/18* (2006.01)
(Continued)

(52) U.S. Cl.
CPC ........... *H02N 2/186* (2013.01); *B60C 23/041* (2013.01); *H01L 41/113* (2013.01);
(Continued)

(58) Field of Classification Search
CPC ............... H01L 41/113; H01L 41/1132; H01L 41/1134; H01L 41/1136; H01L 41/1138; H02N 2/18
(Continued)

(56) References Cited

U.S. PATENT DOCUMENTS 3,539,841 A * 11/1970 Riff .......................... H02N 2/18
                                                    123/642
5,835,996 A    11/1998 Hashimoto et al.
(Continued)

FOREIGN PATENT DOCUMENTS

EP    2408091 A1    1/2012

OTHER PUBLICATIONS

International Search Report, PCT/GB2013/051172, 4 pages, dated Aug. 30, 2013.

*Primary Examiner* — Derek Rosenau
(74) *Attorney, Agent, or Firm* — Dorsey & Whitney LLP (57) ABSTRACT

A device able to generate electrical power through relative rotational motion of first (370, 380) and second (200, 230) principal components around an axis of rotation (220); wherein: the first and second principal components comprise an arrangement of piezoelectric elements (380) and permanent magnets (230, 370) such that the interaction between these magnets and piezoelectric elements, in use, makes it possible to generate electricity; and wherein: the second principal component (200, 230) comprises a center of mass offset from the axis of relative rotation (220) such that the response of the second principal component (200, 230) to either gravitational or inertial forces is a relative rotation of the second principal component (200, 230) in relation to the first principal component (370, 380); the first principal component (370, 380) being fixedly attached to the moving host structure (100).

13 Claims, 5 Drawing Sheets (51) Int. Cl.
*B60C 23/04* (2006.01)
*H02K 7/18* (2006.01)

(52) U.S. Cl.
CPC .............. *H02K 7/1892* (2013.01); *H02N 2/18* (2013.01); *H02N 2/181* (2013.01)

(58) Field of Classification Search
USPC ........................................................ 310/339
See application file for complete search history.

(56) References Cited

U.S. PATENT DOCUMENTS

| | | | |
|---|---|---|---|
| 7,696,673 B1* | 4/2010 | Yavid | F42C 11/02 310/329 |
| 2009/0015103 A1 | 1/2009 | Rastegar | |
| 2010/0052324 A1* | 3/2010 | Priya | C04B 35/493 290/50 |
| 2011/0048133 A1* | 3/2011 | Lin | G01P 15/09 73/514.34 |
| 2011/0193350 A1 | 8/2011 | Rastegar | |

* cited by examiner

Figure 8 ical Application No. PCT/GB2013/051172, filed May 3,
POWER GENERATION DEVICE

CROSS-REFERENCE TO RELATED APPLICATIONS

This application is a national stage application of International Application No. PCT/GB2013/051172, filed May 3, 2013, and entitled "POWER GENERATION DEVICE", which claims priority to GB Application No. 1207987.7, filed May 4, 2012, and entitled "POWER GENERATION DEVICE", both of which are hereby incorporated by reference herein in their entireties.

FIELD

This invention relates to a type of power generation device operable to generate electricity from linear and/or rotational source motion. In the rotational case, the motion may be constant or intermittent. In the linear case the device is operable under discontinuous (e.g. oscillatory) motion. The preferred embodiments are applicable in areas with limited space or reachability for sensing applications. Other implementations are also envisaged.

BACKGROUND

Energy harvesting refers to the use of ambient energy sources to locally generate electrical power. This power can then be used to supplement or replace battery or mains power supply especially in small-scale electronic applications. Vibration or motion is an example of such an ambient energy source that is an abundant source of energy that can be found in many different forms. A number of devices that can make use of vibration or motion have been proposed. The general principle underlying these implementations is to introduce an electrical damping mechanism, often referred to as the transducer, (e.g. an electromagnetic or piezoelectric transducer) counteracting the force exerted by a "proof" mass moving inside a frame. The frame needs only one attachment point to the host structure and thus the motion of the proof mass is caused by inertial reaction forces to the external acceleration, which can be linear or rotational. Consequently, these devices can be broadly categorised as inertial generators.

For continuous rotation, where there is no rotational acceleration, another method has been used. A device known as a gravitational generator relies on an eccentric proof mass and gravity to create a counteracting moment to the host rotation and thus extract power from it through a transducer.

Electromagnetic transducers are widely used for power generators of either conventional, inertial or gravitational type. They rely on the relative motion between two principal components. In general the first principal component, the stator, is held stationary by some sort of mechanical attachment to a base structure. The motion of the second principal component, called a rotor in the case of a rotational device, is electromagnetically coupled to the first principal component. Thus, displacement of the second component requires either a force (for linear implementations) or a torque (for rotational implementations) and by doing work against this force/torque electric power can be generated. The nature of this force or torque (as the case may be) is defined by the general nature of the device and can thus be inertial, gravitational or, in conventional structures, be provided by introducing a second attachment point that connects the second principal component to a moving structure. With a conventional arrangement, large transducer forces can be achieved between the two principal components and consequently the power output can be very high, which is ideal for power generation on a large scale. However, the possibility of having a second attachment point requires more space and is in fact not always easily achievable. One example, not exclusive of other possible applications, can be the installation of a pressure sensor inside a vehicle tyre, where attachment to the moving parts is conveniently possible but connection to a secondary, stationary structure is impeded. Another possibility is placement inside the human body, where attachment to two relatively moving parts/organs can result in highly intrusive surgery.

Mainly in linear devices, piezoelectric transducers have also been used. The key property of a piezoelectric material is that it responds to an applied stress by an accumulation of charge. The advantage is that high output voltages can be achieved without the need for any gearing and that the achievable energy is a function of the stresses inside the material and not the relative velocity of the two principal components as is the case for electromagnetic transducers. Good results have been accomplished using bending structures, because the stresses in a direction perpendicular to the direction of bending are high. Another way to increase the electromechanical coupling is to operate at the resonance frequency of the piezoelectric element. The difficulty of incorporating bending beams in rotational devices has made piezoelectric implementations of this type complicated to date.

A common disadvantage of linear devices is a strong dependence on the orientation of the device and the direction of excitation acceleration. In many cases, gravitational acceleration has to be overcome in order for the internal mass to be able to move at all. This problem can be bypassed if the orientation of the device is constant and the primary direction of excitation is other than (and preferably in a plane perpendicular to) gravity. This is however not always straightforwardly achievable and causes problems in strongly varying conditions, e.g. in human motion. A device with a proof mass rotatable around an axis, this axis being stationary in relation to the host, and a centre of mass not in line with this axis has the advantage of being operable under gravitational as well as inertial circumstances.

There is therefore a need to address this problem.

SUMMARY

According to a first aspect of this invention, there is provided a device operable to generate electrical power. This device comprises first and second principal components, wherein capability of relative rotational motion between said first and second components is a requirement for operation. The capability of relative rotational motion between first and second components, around a common axis of relative rotation, may be used for transformation of kinetic energy into electrical energy. Despite this transformation of energy resulting from a relative rotational motion, this invention, wherein only the first principal component is required to be fixedly attached to a host structure, acting as a source of motion, is operable primarily, but not exclusively, under discontinuous linear and/or continuous/discontinuous rotational excitation as well as combinations thereof, provided by said host structure and transmitted to the device through the previously mentioned single mechanical connection point. It will be appreciated that the connection point can be chosen deliberately on any source of motion and does not necessarily need to be, e.g., on the axis of a rotating host structure. The second principal component, rotatable around the axis of relative rotation, comprises an eccentric centre of mass, i.e. offset from the axis of rotation, in a way that any force and/or acceleration acting on this centre of mass, having a direction non parallel to the axis of rotation, will cause a torque around this axis wherein this torque, acting on a transducing element impeding the relative motion to the first principal component, may be used to convert energy from a mechanical into an electrical form and can be of either inertial or gravitational nature or a combination thereof in dependence of the orientation of the first and second principal components in relation to the external forces and/or accelerations provided by the host structure, these comprising gravitational acceleration, but not being exclusive to the latter. The term "impedes" should be viewed in a broad sense of counteracting the relative rotation between the first and second principal components. The description of forces and accelerations not parallel to the axis of rotation herein includes the principle that a moment around an axis of rotation can effectively be represented by a pair of forces of equal strength but opposite direction and having their point of action at a fixed distance from the axis on opposing sides relative to the axis. Thus the described device is also operable by a moment or an angular acceleration around the axis of rotation and acting on the second principal component.

Embodiments provide a rotational device, operable under discontinuous linear as well as continuous/discontinuous rotational external excitation requiring only a single point of attachment to the source of motion. This addresses the problem identified above. Furthermore, embodiments can comprise a piezoelectric transduction mechanism operable at its natural frequency.

Necessity for only a single fixedly attached contact point of the device may make installation easier for certain applications and possibly reduce the overall size, due to the lack of connection to a second point. Furthermore, the ability to operate under various forms of excitation may make the device more versatile in its use, especially, but not only, in applications with highly varying source motion and device orientation, e.g. medical and body sensor applications.

Thus, the first principal component may comprise one or more piezoelectric bending beams, each one of the beams having one end fixedly mounted onto the first principal component and one end able to freely vibrate. The free end of the beam(s) attached to the first principal component comprise a permanent magnet, the primary magnet(s). The second principal component may hold one or more permanent magnets, the secondary magnet(s), in an arrangement where there is an attractive or a repulsive force between the primary and secondary magnet(s), as the second principal component moves in relative rotational motion to the first principal component. It will be appreciated that the arrangement between the beam(s), holding the primary magnet(s), and the secondary magnet(s) of the second principal component is done in a manner such that there is no physical contact between the primary and secondary magnet(s) as they pass each other under relative motion. As a result of the interaction force between the primary and secondary magnet(s), this force being either repulsive or attractive, depending on the relative orientation between primary and secondary magnets, the free end of the piezoelectric beam(s) may be deflected and the resulting electrical charges in the material extracted in order to generate electrical power. The deflection can be achieved in various ways, particularly, but not limited to, a fashion where the free end of the beam(s) experiences a sudden release after the point where the equilibrium between magnetic interaction force and beam bending force is reached, and the free end is consequently being left to vibrate at its natural frequency by virtue of the introduced initial deflection.

Furthermore, it will be appreciated that possible, but not limited, methods of adjusting the magnetic interaction force between primary and secondary magnet(s) are the variation of the gap between said magnets or the use of magnets of different strength, wherein the strength of a magnet can be related to its geometry, dimensions, material and/or magnetization as well as combinations thereof. In addition, the description of this invention comprises piezoelectric bending beams in all possible forms known in the art. Thus comprising, without exclusion of other possibilities, beams using one or more piezoelectric layer(s), different support materials and/or various piezoelectric materials, beams of various thickness, dimensions and generally geometric shape. It is to be understood that a combination of the aforementioned alterations to the beam(s) can have an effect on the stiffness, damping and electrical properties of the beam(s) and can thus be exploited, possibly in conjunction with the previously described alterations to the magnetic interaction force, to determine the ideal equilibrium point between magnetic interaction and beam bending force in order to maximise power output.

In another embodiment the device may comprise a circuit for power processing, internal to the device or externally connected via electric contacts, capable of performing, inter alia, one or more of the following tasks: rectification of the output voltage, i.e. conversion from AC electricity to DC electricity, regulation of the output voltage to a level usable by an attached load, e.g. a sensor, application of a pre-bias voltage or any other method in order to maximise power output, maximum power point tracking and/or charging of a rechargeable battery.

According to a second aspect of this invention, there is provided a device for generating electricity by acceleration of and/or changes in orientation of the device, the device comprising first and second principle components, wherein:
the first principle component is mounted relative to the housing for resilient deformation and to generate electricity when so deformed;
the second principle component is rotationally mounted relative to the housing for rotation relative to the housing and the first component, the centre of mass of the second component being offset from its axis of rotation; and
the two components are arranged to interact with each other during at least part of the rotational path of the second component to deform the first component and thereby generate electricity.

The first component may be substantially fixedly mounted for the resilient deformation. The resilient deformation may be deflection. The resilient deformation may be bending. The first component may be mounted as a cantilever with one end substantially fixedly mounted relative to the housing. The deformation may be bending.

The first component may be resiliently deformable. It may comprise a substrate of a resiliently deformable material. The substrate may act as a leaf spring. The substrate may be of spring steel.

The first component may comprise electricity-generating material that generates electricity when it is subject to the deformation. The electricity generating material may be a piezoelectric material. The electricity generating material may be fixed to the substrate such that deformation of the substrate results in deformation of the electricity generating material.

At least one of the first and second components may comprise one or more magnets. The or each magnet may be arranged such that during at least part of the rotational path of the second component, the first component is deformed and thereby generates electricity. Both the first and second components may comprise at least one respective magnet, the magnet on each component interacting with that on the respective other component along at least part of the rotational path of the second component to deform the first component.

The first component may be arranged, upon receiving an initial displacement, to vibrate at the natural frequency of the electricity-generating material.

Optional features of the first aspect of the invention, such as features of embodiments of the first aspect, may also be optional features of the second aspect of the invention. In particular, the features of dependent claims 11 to 20 may also be features of the second aspect and so, in embodiments, combined with the features of claim 1.

Possible applications of the invention are the internal or external attachment to a vehicle tyre or a human being or any other source of motion, preferably but not necessarily, providing excitation characterized by random low frequencies and large amplitudes with the goal to power, e.g., a wireless sensor.

BRIEF DESCRIPTION OF THE DRAWINGS

Embodiments of the invention will now be described, by way of example only, and with reference to the drawings in which:

In FIGS. 4, 5, 6, 7 and 8, like elements are indicated by like reference numerals.

SPECIFIC DESCRIPTION OF CERTAIN EXAMPLE EMBODIMENTS

Figure 1:
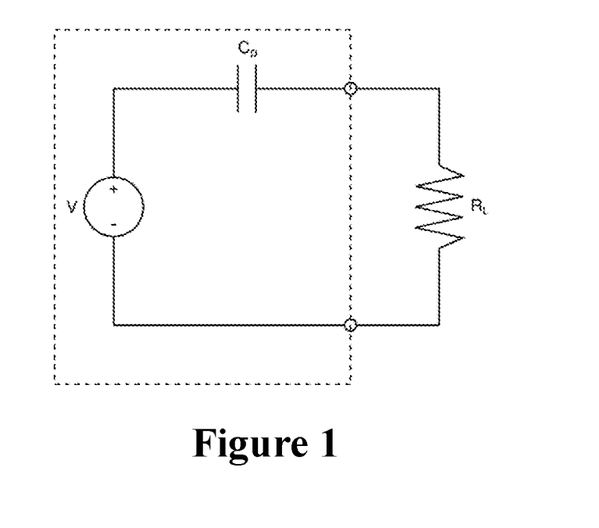
FIG. 1 illustrates an equivalent circuit of a piezoelectric generator.

FIG. 1 shows the simplest possible equivalent circuit of a piezoelectric generator attached to a resistive load $R_L$. The piezoelectric element can be described as an AC (alternative current) voltage source V in series connection with a capacitor $C_P$. The application of Kirchhoff's voltage law around this system gives:

$$V = I_{elec} \cdot \left( \frac{1}{i\omega C_p} + R_L \right) \quad (1)$$

where V is the generated voltage, $I_{elec}$ is the current around the circuit and $\omega$ is the operation frequency. The generated voltage V in this case is directly proportional to the applied force, stress or strain on the material and the electrical power P dissipated in the load resistor is:

$$P = \frac{V^2 R_L}{\left( \left( \frac{1}{\omega C_p} \right)^2 + R_L^2 \right)} \quad (2)$$

The maximum power transfer theorem yields that the maximum power is achieved when the magnitude of the load impedance matches the magnitude of the impedance of the piezoelectric material, i.e.:

$$R_L = \frac{1}{\omega C_p} \quad (3)$$

Figure 2:
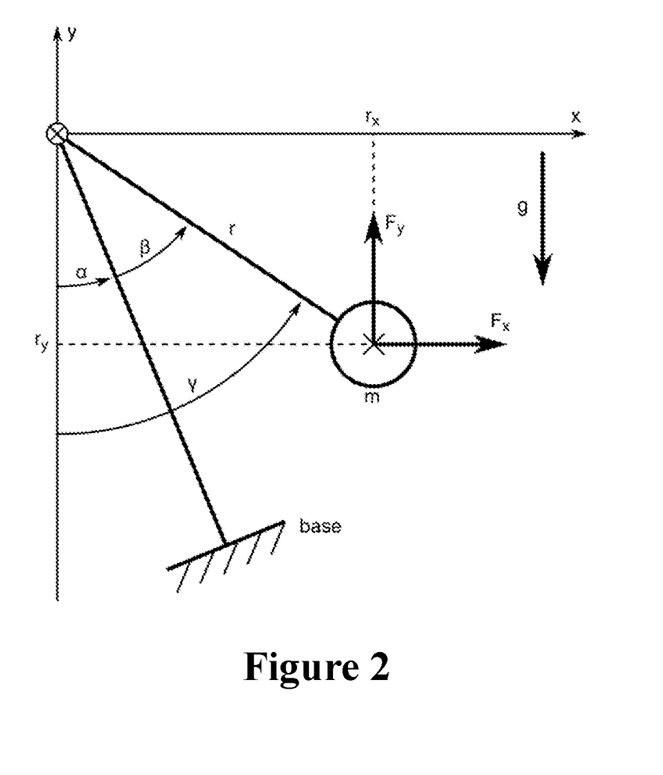
FIG. 2 is a schematic illustrating the motion of an eccentric mass around an axis of rotation under different external excitations.

Turning to FIG. 2, the schematics shown in FIG. 2 help to explain the dynamic behaviour of an eccentric point mass m situated at a distance r from its axis of rotation (the z-axis of the depicted coordinate system in the case of FIG. 2) under gravitational and external excitation. The values $r_x$ and $r_y$ describe the coordinates of the mass in the x and y directions respectively and the forces $F_x$ and $F_y$ are inertial reaction forces acting on the proof mass in these directions as a result of external excitation. The gravity g is acting in negative y direction. The angle γ is the angular deflection of the proof mass in relation to the y-axis, defined in a mathematically positive direction. The angle α is representative for rotational base excitation, i.e. rotation of the inertial frame and β is the resulting angle between the mass and the inertial frame, wherein the following relationship holds true:

$$\gamma = \alpha + \beta \quad (4)$$

Furthermore, β describes the relative angle between the first and second principal components of the device and is thus the angle, relevant for the generation of electrical energy.

The basic equation of motion for rotation states that the angular acceleration $\ddot{\gamma}$ multiplied by the mass moment of inertia equals the sum of all n external moments $M_i$ acting on the mass:

$$\ddot{\gamma} \cdot I = \sum_{i=1}^{n} M_i \quad (5)$$

In the case of a simple point mass at a distance r from the rotational axis, the moment of inertia around this axis is given:

$$I = mr^2 \quad (6)$$

Application to the system of FIG. 2 gives:

$$\ddot{\gamma} \cdot I = F_x r_y + (F_y - mg) r_x \quad (7)$$

The coordinates $r_x$ and $r_y$ may be calculated as:

$$\begin{cases} r_x = r \sin \gamma \\ r_y = r \cos \gamma \end{cases} \quad (8)$$

From which follows:

$$\ddot{\gamma} \cdot I = F_x r \cos \gamma + (F_y - mg) r \sin \gamma \qquad (9)$$

Which may be rewritten (using (4)) as:

$$(\ddot{\alpha} + \ddot{\beta}) \cdot I = F_x r \cos(\alpha + \beta) + (F_y - mg) r \sin(\alpha + \beta) \qquad (10)$$

Equation (10) is representative for the relative rotational motion between the first and second principal components in an undamped case and shows the influence of linear and rotational excitation, be it continuous or discontinuous.

Figure 3:
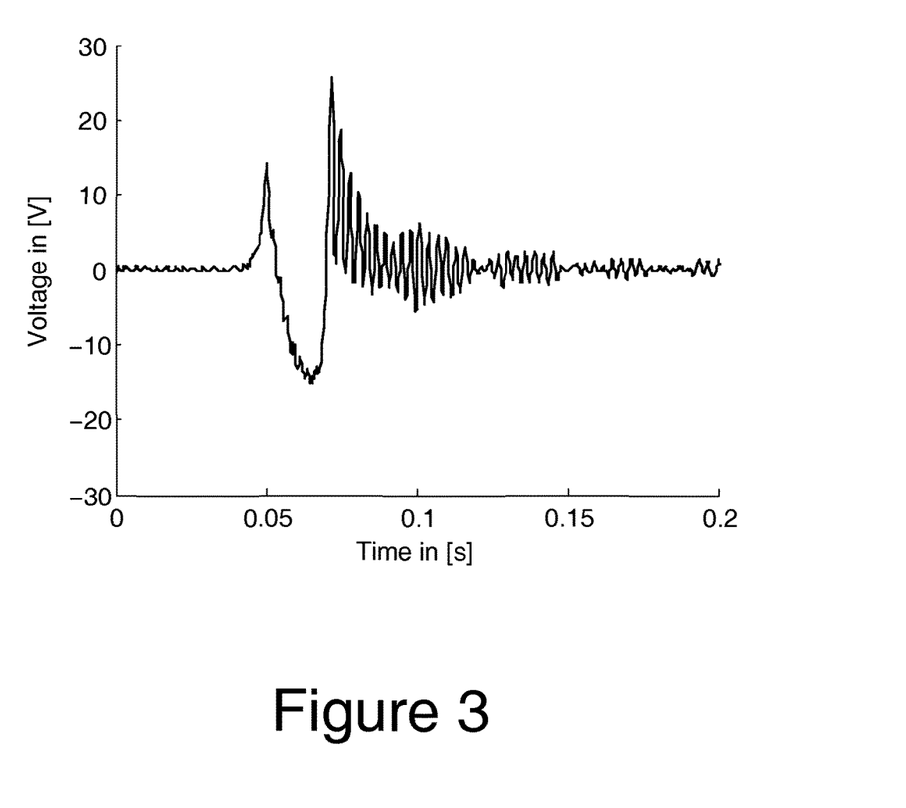
FIG. 3 is the voltage output of a piezoelectric beam left to vibrate after initial excitation.

FIG. 3 shows one example of what the open circuit voltage at the terminals of a piezoelectric beam can look like when released after an initial excitation, in an arrangement where the force between the magnets is attractive. The first peak in the graph occurs when the magnet on the second principal component approaches the magnet on the tip of the piezoelectric beam. The tip of the beam receives an initial acceleration towards the approaching magnet and is then held close to it due to the magnetic force, travelling together with the second principal component until the beam bending force exceeds the magnetic attraction force and the beam gets released to vibrate at its own natural frequency after the second peak in the graph.

Figure 4:
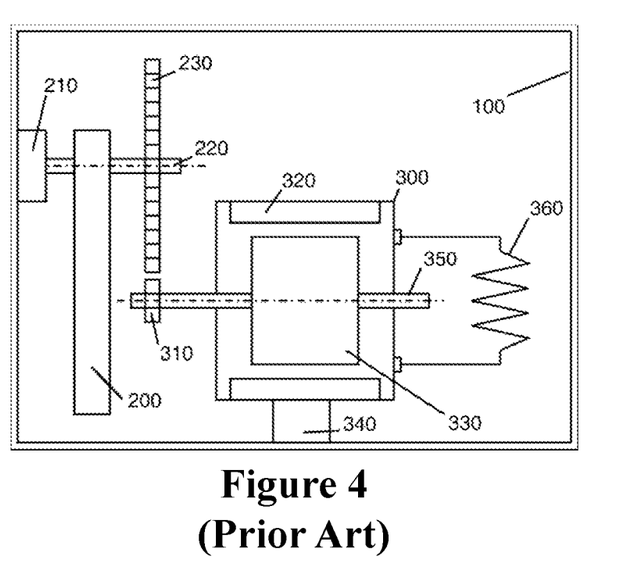
FIG. 4 illustrates a generator for timepieces as known in the art.

FIG. 4 illustrates a prior art electromagnetic generator as it is currently employed in wristwatches. An eccentric mass 200 is fixedly connected via a shaft 220 to a large gear wheel 230. The assembly of these components 200, 220 and 230 is connected to an inertial frame 100 via a bearing 210 so that a rotational degree of freedom in relation to the inertial frame is maintained. The large gear wheel 230 is acting on a smaller gear wheel 310, thus effectively increasing the rotational speed of a shaft 350 fixedly attached to a rotor 330. The rotor 330 rotates relatively to a stator 300 holding magnets 320. An arrangement of coils on the rotor 330 makes the generation of electricity possible through the electromagnetic interaction with the magnets 320 in a way as it is well known in the art of conventional generators. The stator 300 itself is connected to the inertial frame 100 via a connection 340. Ultimately a load 360 can be powered by the generated electricity.

Figure 5:
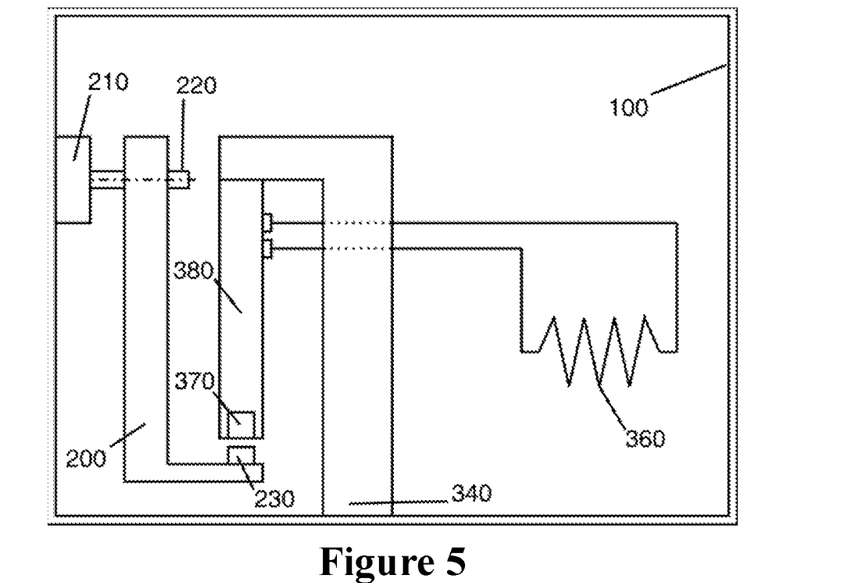
FIG. 5 shows a possible implementation of the invention for timepieces.
Figure 6:
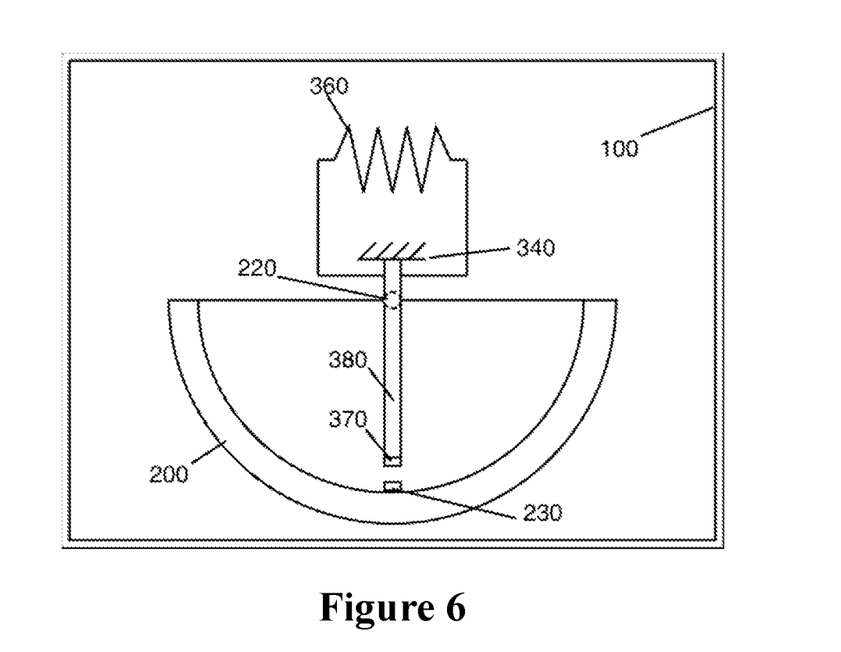
FIG. 6 illustrates the first embodiment of the device.

FIGS. 5 and 6 illustrate a first embodiment of the present invention as it could be used to replace the prior art generator from FIG. 4. In this case a permanent magnet 230 is fixedly attached to an eccentric mass 200. The eccentric mass 200 is fixedly attached to a shaft 220 and, by means of a bearing 210, is free to rotate around the axis of said shaft 220 in relation to the inertial frame 100. A second permanent magnet 370 is fixedly attached to the tip of a piezoelectric beam 380. The piezoelectric beam 380 does not require any external attachment points other than the connection to the inertial frame 100 via the mounting 340. It will be appreciated that the permanent magnets 230 and 370 can be arranged in various different ways in relation to each other, e.g. such that the magnetic force between them is either repulsive or attractive. Given that the beam 380 is fixed to the inertial frame 100 and the eccentric mass 200 can freely rotate around the axis of shaft 220, a relative motion between the eccentric mass 200 and the beam 380 is possible. Under relative motion between these first and second principal components the interaction of the magnets 230 and 370 will lead to a deflection of the piezoelectric beam 380. Consequently, given the inherent properties of piezoelectric materials, electric energy can be extracted from the beam 380. This energy can then be used to power an external load 360. It will be appreciated that the shown external load 360 is present as an example only and can take on various different forms, such as a sensor or any form of electric circuitry. Furthermore, this load 360 is not necessarily situated within the inertial frame 100 but can, as an example, be connected via external connectors and be situated outside the device.

Figure 7:
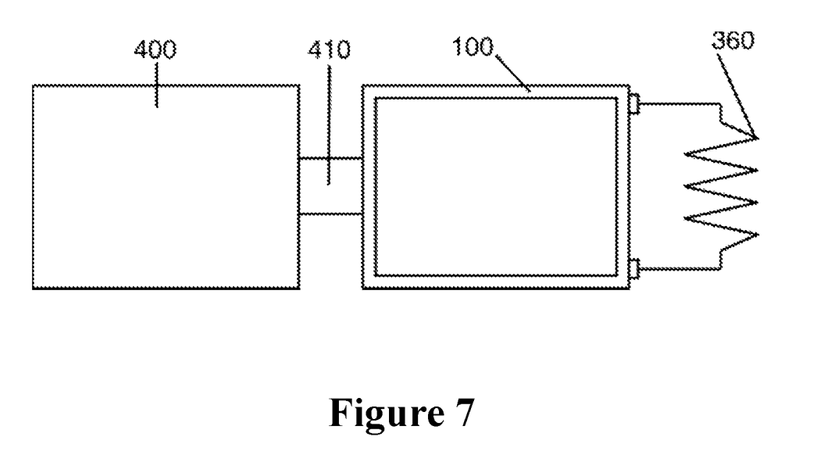
FIG. 7 illustrates a device according to an embodiment of the invention connected to an external source of motion.

FIG. 7 shows such an arrangement, where the load 360 is connected outside the presented device. A possible arrangement of the generator is shown, where the inertial frame 100 is fixedly connected to a source of motion 400 by a single means of connection 410. The source of motion 400 here is representative for any possible excitations, for example, but not exclusively, linear, rotational, discontinuous or continuous excitation.

Figure 8:
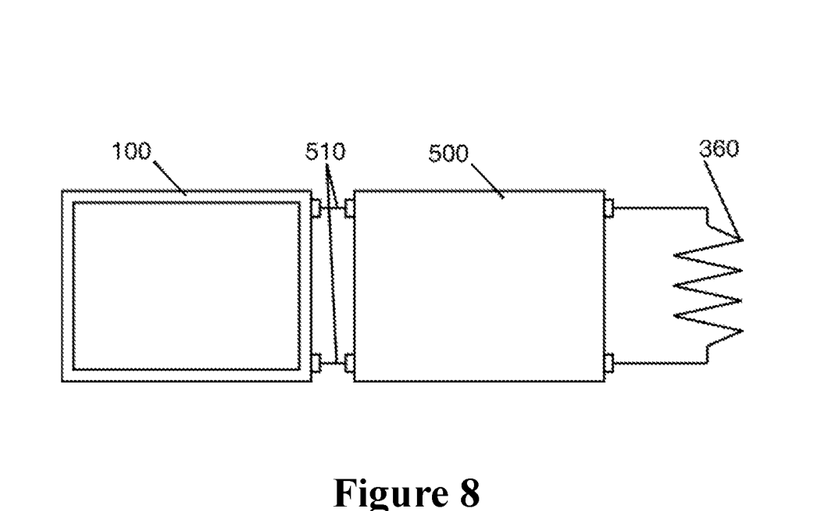
FIG. 8 illustrates a device according to an embodiment of the invention connected to a power processing circuit.

FIG. 8 illustrates another possible application of the invention. A load 360 may require a power supply of a particular form, e.g. a DC (direct current) voltage. The voltage output from the invention may not provide a supply to the exact specification needed by the load 360. In this case a circuit 500 may be connected to the inertial frame 100 via electrical connectors 510. The task of this circuit 500 would be to fulfill the requirements of the load and would achieve one or more of the following: conversion from AC (alternative current) to DC voltage, intermediate energy storage or regulation of the output voltage to a suitable level as well as limiting current as to prevent any connected parts from damage.

In the embodiment of FIG. 6, the beam 380 is shown extending through the axis of the eccentric mass 200. In other embodiments it is envisaged that the beam be mounted to the side of the axis (that is, displaced laterally with respect to the beam in the FIG. 6 embodiment) such that the beam does not extend generally along a radius. This may give packaging advantages in certain applications. The second permanent magnet 270 would still be engaged in the same way in order to deflect the beam 380.

In still other embodiments, the beam 380 may be larger than that of the FIG. 6 embodiment such that it extends across as much of the diameter of the device as is possible. As before, the beam would be fixed at one end and free at the other such that the beam is deflected in substantially the same way.

In another embodiment, the beam may be provided with a non-magnetised material that can be attracted and/or repelled by a magnet, for example a quantity of iron, at its free end in substitution for the second permanent magnet 270 to interact with the first permanent magnet 230 on the rotatable mass 200. Alternatively, this arrangement may be reversed, with the mass 200 being provided with the non-magnetised material and the beam being provided with the permanent magnet.

In another embodiment no permanent magnets may be provided on either the eccentric mass 200 or the beam 380 and instead the beam and the mass may be arranged such that the mass abuts structure of the beam during rotation to deflect the beam to a point at which the abutment ceases and the beam is released to recover its deflection. In other words, the arrangement may make use of mechanical plucking.

In at least some of the previously described embodiments, the device is in the form of a rotational, inertial harvester using piezoelectric beam transduction. Despite the focus on having an eccentric proof mass, the device would still work in a purely inertial way under alternating rotational excitation with a proof mass that has its centre of gravity on the axis of rotation. Embodiments arranged in this way are therefore also envisaged.

The invention claimed is:

1. A device for generating electricity by acceleration of and/or changes in orientation of the device, the device comprising first and second principle components, wherein:
   the first principle component is mounted relative to a housing for resilient deformation and to generate electricity when so deformed;
   the second principle component is rotationally mounted relative to the housing for rotation relative to the housing and the first component, the center of mass of the second component being offset from its axis of rotation;
   the first component extends through the axis of rotation of the second component;
   the first component and/or the second component comprises one or more magnets;
   the or each magnet is arranged such that during at least part of the rotational path of the second component, at least one magnet on one of the first and second component interacts with the other of the first and second component, or a magnet thereon, to deform the first component and thereby generate electricity.

2. A device according to claim 1, wherein the first component is mounted as a cantilever with one end substantially fixedly mounted relative to the housing.

3. A device according to claim 1, wherein the deformation is bending.

4. A device according to claim 1, wherein the first component comprises a substrate of a resiliently deformable material.

5. A device according to claim 1, wherein the first component comprises electricity-generating material that generates electricity when it is subject to the deformation.

6. A device according to claim 1, wherein the one or more magnets comprise a series of magnets.

7. A device according to claim 1, wherein both the first and second components comprise at least one respective magnet, the magnet on each component interacting with that on the respective other component along at least part of the rotational path of the second component to deform the first component.

8. A device according to claim 1, wherein the first component is arranged, upon receiving an initial displacement, to vibrate at the natural frequency of the electricity-generating material.

9. A device according to claim 1, further comprising an electrical circuit operable to regulate electricity generated by the device.

10. A device according to claim 9, wherein the electrical circuit operable to regulate electricity is arranged to carry out one, more or all of the following or any combination thereof:
    rectification from AC electricity to DC electricity;
    converting electricity at a varying voltage to electricity at a more constant voltage;
    storing energy generated by the device;
    limiting the current supplied to a load so as to prevent damage to the generator or load or for some other purpose; and
    supplying power to an attached load.

11. A device according to claim 10, wherein the attached load is a wireless sensor.

12. A device according to claim 1, wherein the first principal component is attached internally or externally to a car tire or a human or animal body or to any other source of motion.

13. A device according to claim 5, wherein the electricity-generating material comprises a piezoelectric material.

* * * * *